(12) United States Patent
Endo et al.

(10) Patent No.: US 11,039,557 B2
(45) Date of Patent: Jun. 15, 2021

(54) MOUNTING APPARATUS AND MOUNTING METHOD

(71) Applicant: FUJI CORPORATION, Chiryu (JP)

(72) Inventors: Daisuke Endo, Nagoya (JP); Yusuke Tsuchiya, Toyota (JP); Shigenori Sengoku, Anjo (JP)

(73) Assignee: FUJI CORPORATION, Chiryu (JP)

( * ) Notice: Subject to any disclaimer, the term of this patent is extended or adjusted under 35 U.S.C. 154(b) by 243 days.

(21) Appl. No.: 16/087,902

(22) PCT Filed: Apr. 13, 2016

(86) PCT No.: PCT/JP2016/061875
§ 371 (c)(1),
(2) Date: Sep. 24, 2018

(87) PCT Pub. No.: WO2017/179146
PCT Pub. Date: Oct. 19, 2017

(65) Prior Publication Data
US 2019/0045679 A1  Feb. 7, 2019

(51) Int. Cl.
*H05K 13/00* (2006.01)
*H05K 13/02* (2006.01)
*H05K 13/04* (2006.01)

(52) U.S. Cl.
CPC ......... *H05K 13/0015* (2013.01); *H05K 13/02* (2013.01); *H05K 13/022* (2013.01); *H05K 13/0413* (2013.01)

(58) Field of Classification Search
CPC .. H05K 13/0413; H05K 13/02; H05K 13/022; H05K 13/0015
See application file for complete search history.

(56) References Cited

U.S. PATENT DOCUMENTS

| 8,773,530 B2* | 7/2014 | Ding | H04N 7/18 |
| | | | 348/135 |
| 10,130,019 B2* | 11/2018 | Tsuge | H05K 13/08 |

(Continued)

FOREIGN PATENT DOCUMENTS

| CN | 103491762 A | 1/2014 |
| JP | 6-216576 A | 8/1994 |

(Continued)

OTHER PUBLICATIONS

International Search Report dated Jul. 19, 2016 in PCT/JP2016/061875 filed on Apr. 13, 2016.

*Primary Examiner* — Peter Dungba Vo
*Assistant Examiner* — Jeffrey T Carley
(74) *Attorney, Agent, or Firm* — Oblon, McClelland, Maier & Neustadt, L.L.P.

(57) ABSTRACT

Mounting apparatus executes a first mode of, at least when tray member is first moved to a collection position, capturing an image of fiducial marks and obtaining a correction value by which the collection position of component P is corrected based on the positions of fiducial marks in the captured image. Further, mounting apparatus executes a second mode of, when tray member is moved to the collection position, capturing an image of fiducial marks and obtaining a correction value by which the collection position of component P is corrected based on the positions of fiducial marks in the captured image, the correction value being obtained more frequently than in the first mode.

10 Claims, 5 Drawing Sheets

(56) References Cited

U.S. PATENT DOCUMENTS

| | | | | |
|---|---|---|---|---|
| 10,743,445 B2* | 8/2020 | Fukumoto | .......... | H05K 13/0434 |
| 2006/0048383 A1* | 3/2006 | Nishiwaki | .......... | H05K 13/0413 |
| | | | | 29/833 |
| 2008/0289175 A1* | 11/2008 | Inoue | .................. | H05K 3/3485 |
| | | | | 29/840 |

FOREIGN PATENT DOCUMENTS

| | | |
|---|---|---|
| JP | 10-335889 A | 12/1998 |
| JP | 2000-117592 A | 4/2000 |
| JP | 2010-245236 A | 10/2010 |

* cited by examiner

MOUNTING APPARATUS AND MOUNTING METHOD

TECHNICAL FIELD

The present application relates to a mounting apparatus and a mounting method.

BACKGROUND ART

A mounting apparatus that reads fiducial marks on a component supply pallet and calculates a fixed position error thereof has been previously proposed (refer to, for example, Patent Document 1). In this apparatus, a positional deviation between a component holding section and a component receiving section can be corrected to improve component receiving accuracy. Further, a mounting apparatus wherein pickup of components from a pallet with a positioning hole and a mark is stabilized by correcting the pickup position based on recognition of the mark has also been previously proposed (refer to, for example, Patent Document 2).

PRIOR ART

Patent Literature

Patent Document 1: JP-A-6-216576
Patent Document 2: JP-A-10-335889

BRIEF SUMMARY

Technical Problem

The mounting apparatuses described in Patent Documents 1 and 2 are designed to stabilize component collection by using fiducial marks, but a more accurate or more efficient manner of component collection has not been taken into consideration in these previously proposed mounting apparatuses.

The present disclosure has been made in view of the above and aims to provide a mounting apparatus and a mounting method by which components are collected in a more accurate or more efficient manner.

Solution to Problem

To achieve an object described above, the disclosure adopts the following:

That is, the mounting apparatus of the present disclosure is a mounting apparatus used for a mounting process of collecting and mounting components, including:
  a tray member configured to move between an accommodating position and a collection position, the tray member having fiducial marks in multiple positions and accommodating components;
  an imaging section configured to capture an image of the fiducial marks; and
  a control unit configured to execute either a first mode of, at least when the tray member is first moved to the collection position, capturing an image of the fiducial marks and obtaining a correction value by which the collection position of a component is corrected based on the positions of the fiducial marks in the captured image; or a second mode of, when the tray member is moved to the collection position, capturing an image of the fiducial marks and obtaining a correction value by which the collection position of a component is corrected based on the positions of the fiducial marks in the captured image, the correction value of the second mode being obtained more frequently than in the first mode.

This mounting apparatus executes the first mode in which the correction value to correct the collection position of the component is obtained by making use of the fiducial marks of the tray member when the tray member is first moved to the collection position, and the second mode in which the correction value to correct the collection position of the component is obtained more frequently when the tray member is moved to the collection position repeatedly. In this apparatus, component collection is performed more accurately by executing the second mode, and component collection is performed more efficiently by executing the first mode. Here, "tray member" includes not only a tray main body but also a connecting section that is connected to the tray main body with positional accuracy ensured, and the fiducial marks may be provided on the connecting section.

The mounting apparatus of the present disclosure is a mounting apparatus used for a mounting process of collecting and mounting components, and is provided with
  a tray member having a fiducial mark in multiple positions thereof, accommodating a component therein and configured to move between an accommodating position and a collection position;
  an imaging section configured to capture an image of the fiducial marks; and
  a control unit configured to execute either
    a first correction process of capturing an image of the fiducial marks at two locations on the tray member and obtaining a correction value by which the position and the tilt of the tray member are corrected based on the positions of the fiducial marks in the captured image, and
    a second correction process of capturing an image of the fiducial marks at three or more locations on the tray member and obtaining a correction value by which the position, the tilt, and the deformation of the tray member are corrected based on the positions of the fiducial marks in the captured image.

This mounting apparatus executes the first correction process of obtaining the correction value to correct the position and the tilt of the tray member by making use of the fiducial marks at two locations, and the second correction process of obtaining the correction value to correct the position, the tilt, and the deformation of the tray member by making use of the fiducial marks at three locations. In this mounting apparatus, component collection is executed more efficiently by executing the first correction process and component collection is executed more accurately by executing the second correction process.

DESCRIPTION OF EMBODIMENTS

Figure 1:
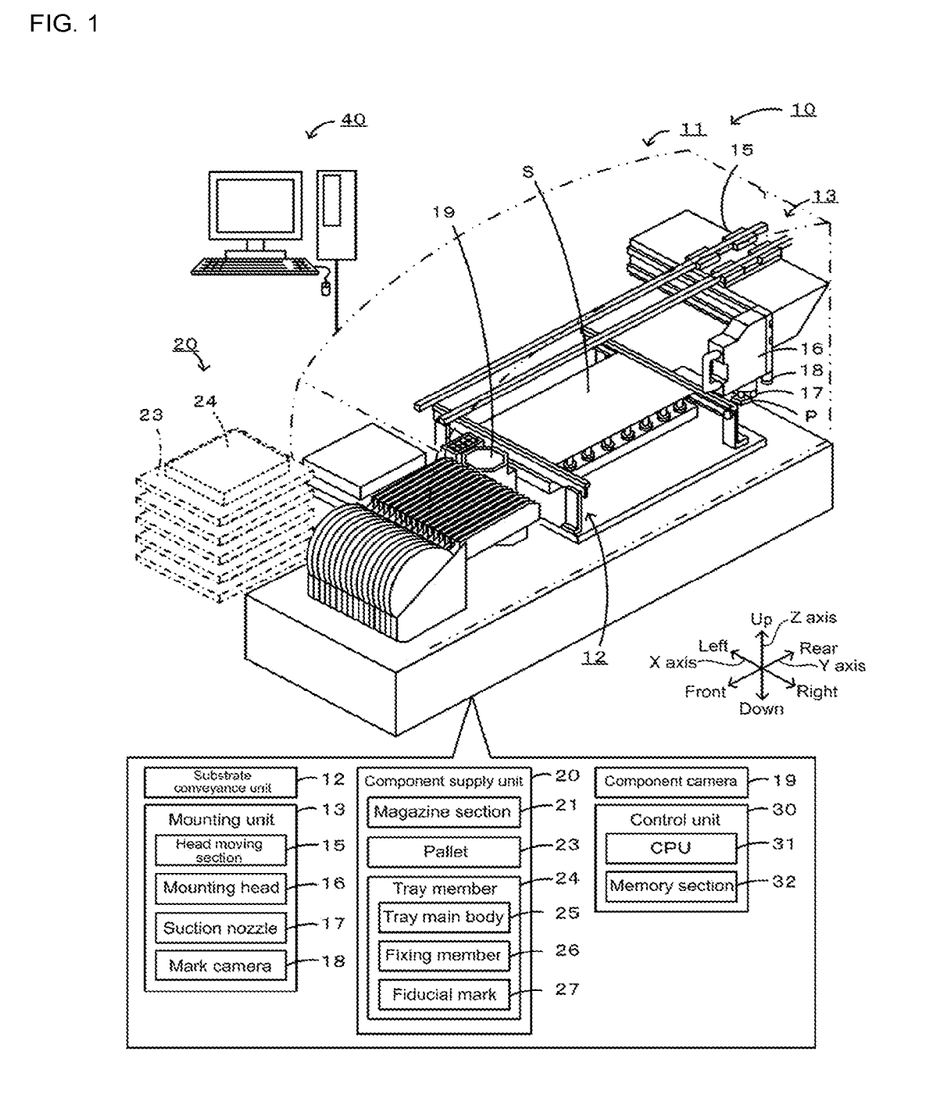
FIG. 1 is a schematic drawing showing an example of a configuration of mounting apparatus 11.
Figure 2:
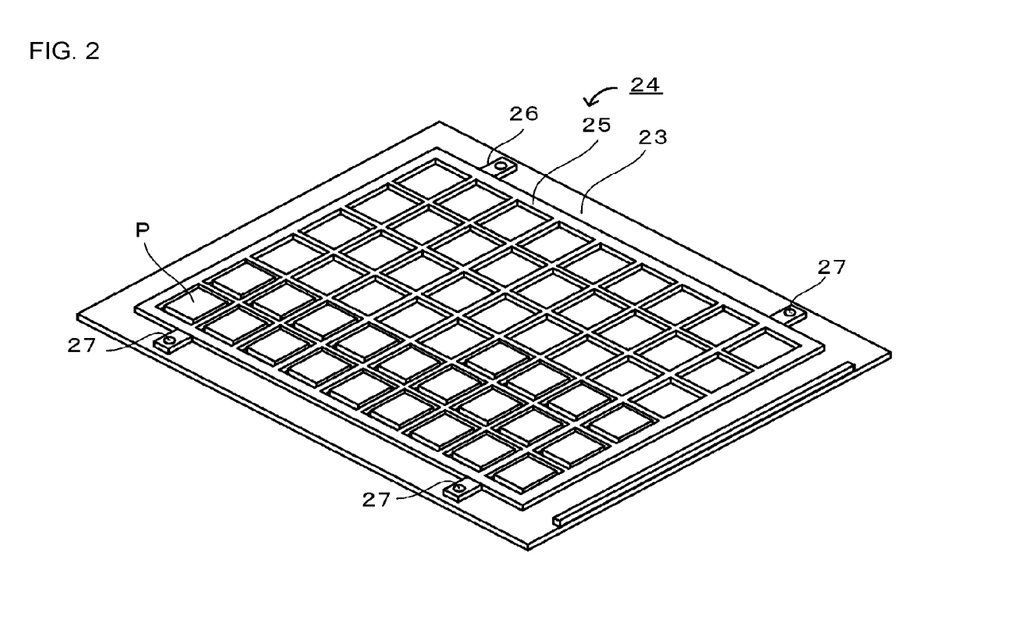
FIG. 2 is a schematic drawing showing an example of pallet 23 and tray member 24.

Referring to the drawings, a preferred embodiment of the disclosure will be described below. FIG. 1 is a drawing showing a schematic example of a configuration of mounting apparatus 11 of mounting system 10. FIG. 2 is a drawing showing an example of pallet 23 and tray member 24. Mounting system 10 is, for example, as shown in FIG. 1, a system for executing a mounting process of disposing component P on substrate S. Mounting system 10 includes mounting apparatus 11 and management computer (PC) 40. In mounting system 10, multiple mounting apparatuses 11 are arranged from an upstream to a downstream side. In FIG. 1, only one mounting apparatus 11 is shown for convenience of description. Management PC 40 manages mounting job information including processing conditions in mounting apparatus 11. In the embodiment, the left-and-right direction (i.e., the X-axis), the front-and-rear direction (i.e., the Y-axis), and the up-and-down direction (i.e., the Z-axis) are as shown in FIG. 1.

The mounting apparatus 11 has substrate conveyance unit 12, mounting unit 13, component camera 19, component supply unit 20, and control unit 30. Substrate conveyance unit 12 is a unit that loads, conveys, and fixes substrate S at the mounting position, and then unloads substrate S. Substrate conveyance unit 12 has a pair of conveyor belts which are provided with a space therebetween in the front-rear direction in FIG. 1 and are laid down in the left-right direction. Substrate S is conveyed by these conveyor belts.

Mounting unit 13 collects a component from component supply unit 20 and places the component on substrate S fixed by substrate conveyance unit 12. Mounting unit 13 has head moving section 15, mounting head 16, and suction nozzle 17. Head moving section 15 includes a slider, which is guided by guide rails to move in the XY direction, and a motor that drives the slider. Mounting head 16 is detachably mounted on the slider and is moved in the XY direction by head moving section 15. One or more suction nozzles 17 are removably mounted on the underside of mounting head 16. Suction nozzle 17 is a collection member for collecting components P using pressure. It should be noted that this collection member may be a mechanical chuck that grabs components P. In addition, mark camera 18 is provided on mounting head 16 to capture images of substrate S from above. Mark camera 18, having an image-capturing area directed downwards, reads a reference position on substrate S or fiducial mark 27 affixed to tray member 24. Mark camera 18 moves in the XY direction together with mounting head 16.

Component camera 19 is disposed between substrate conveyance unit 12 and component supply unit 20. Component camera 19 has an image-capturing area directed upwards, above component camera 19. When suction nozzle 17 holding component P passes over component camera 19, component camera 19 captures an image of the component P being held by the suction nozzle 17 from below and outputs the captured image to control unit 30.

Component supply unit 20 includes multiple feeders, each feeder having a reel, and a tray unit that accommodates multiple trays. The feeder feeds tape, wound around the reel and holding components, thereby suppling components P to mounting unit 13. The tray unit includes magazine section 21, pallet 23, and tray member 24. Magazine section 21 accommodates multiple pallets 23, each pallet 23 having a tray member 24 fixed thereto. Pallet 23 is moved by a moving mechanism (not shown) between an initial position (refer to the dotted lines in FIG. 1) in magazine section 21 and a collection position (refer to the solid lines in FIG. 1) where a component P is collected. As shown in FIG. 2, tray member 24 includes tray main body 25, fixing members 26, and fiducial marks 27. Tray main body 25 is a plate-shaped member having a large number of rectangular cavities, and the cavities accommodate components P. Fixing member 26 is a member for fixing tray main body 25 to pallet 23 and is connected to tray main body 25 while being positioned accurately. FIG. 2 shows an example in which tray main body 25 is fixed to pallet 23 at four locations using four fixing members 26. Fiducial marks 27 are used to detect the position of tray main body 25, and are formed on fixing members 26. Fiducial marks 27 may be formed on the upper face of tray main body 25.

The control unit 30 is configured as a microprocessor having CPU 31 as a main constituent element and includes memory section 32 for storing processing programs and the like. Control unit 30 outputs control signals to substrate conveyor unit 12, mounting unit 13, component camera 19, and component supply unit 20, and receives, as inputs, signals from mounting unit 13, component camera 19, and component supply unit 20.

Figure 3:
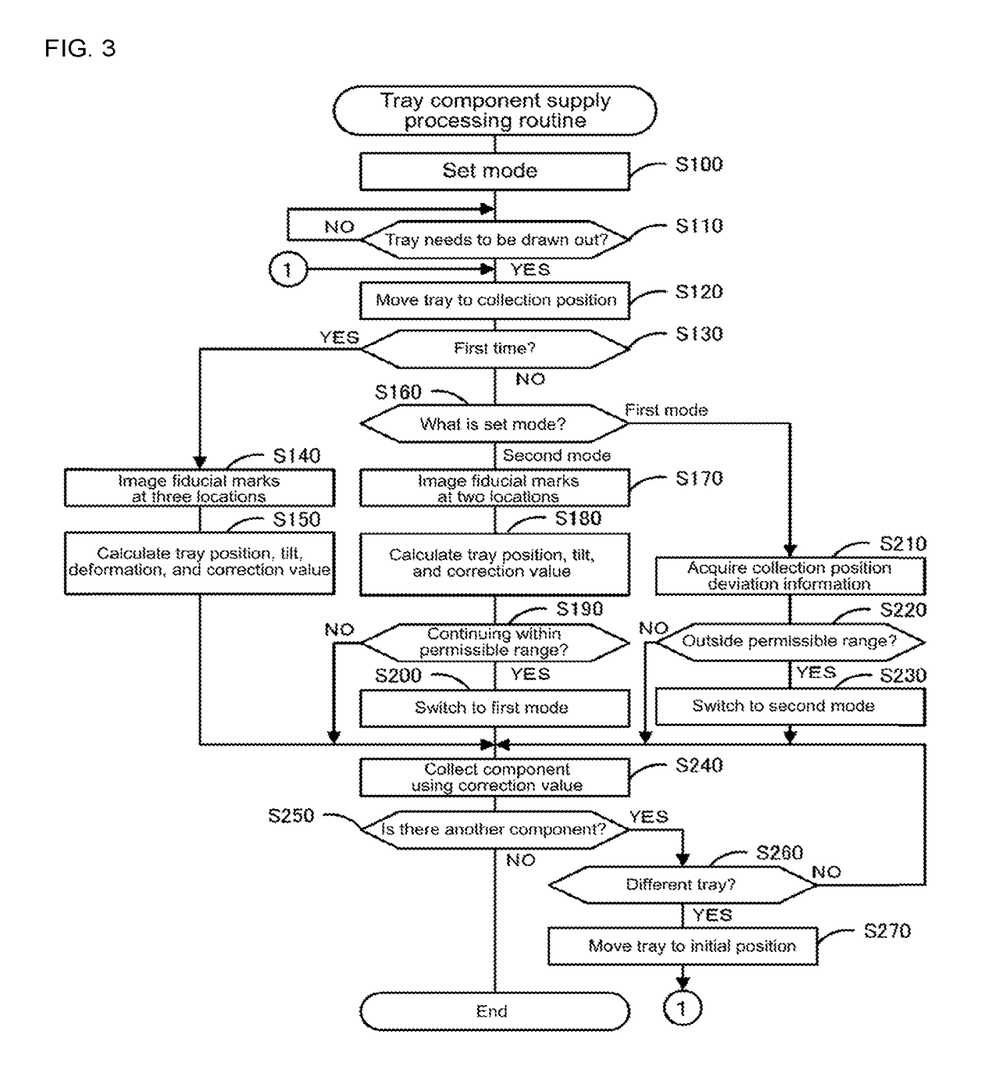
FIG. 3 is a flowchart showing an example of a tray component supply processing routine.

Next, operation of mounting system 10 of the embodiment that is configured as described above, particularly a process of correcting the position of a component P when a component P is collected from the tray unit, will be described. FIG. 3 is a flowchart showing an example of a tray component supply processing routine executed by CPU 31 of control unit 30. This routine is stored in memory section 32 and is executed after mounting apparatus 11 has started a mounting process.

When this routine is started, CPU 31 of control unit 30 sets a mode for correcting the position of a component P that is to be collected from tray member 24 (step S100). This mode includes a first mode in which an image of fiducial marks 27 is captured to obtain a correction value when tray member 24 is first moved to the collection position at least when a new production starts or when trays are replaced, and a second mode in which a correction value is obtained more frequently than in the first mode. In a first mode, the 31 obtains a correction value for the collection position of a component P only for a first time, after which components P are collected with repeated use of the obtained correction value. In a second mode, CPU 31 obtains a correction value each time a tray member 24 is pulled out of magazine section 21, after which components P are collected based on the newly obtained correction values. In step S100, a mode selected in advance by the operator may be set as the mode to be executed. Alternatively, a mode (for example, the second mode) set during an initial stage may be set as the mode to be executed.

Next, CPU 31 determines whether tray member 24 needs to be drawn out based on whether a component P in the tray unit will be collected (step S110). When CPU 31 determines that tray member 24 needs to be drawn out, CPU 31 performs control to move tray member 24 to the collection position (step S120). Next, CPU 31 determines whether tray member 24 is a tray member to be drawn out first (step S130). When CPU 31 determines that the tray member 24 is the tray member that is to be drawn out first, CPU 31 performs control such that mark camera 18 captures an image of fiducial marks 27 provided at three locations on tray member 24 (step S140) and obtains a correction value to correct the position, tilt, and deformation of tray member 24 based on the positions of fiducial marks 27 in the captured image (step S150). Here, CPU 31 executes a first correction process in which images of fiducial marks 27 provided at two locations on tray member 24 are captured to correct the position and tilt of tray member 24 and a second correction process in which images of fiducial marks 27 provided at three or more locations on tray member 24 are captured to correct the position, the tilt, and the deformation of tray member 24. Here, the second correction process is executed when tray member 24 is first drawn out and the first correction process is executed when tray member 24 is drawn out for a second time and afterwards.

Figure 4:
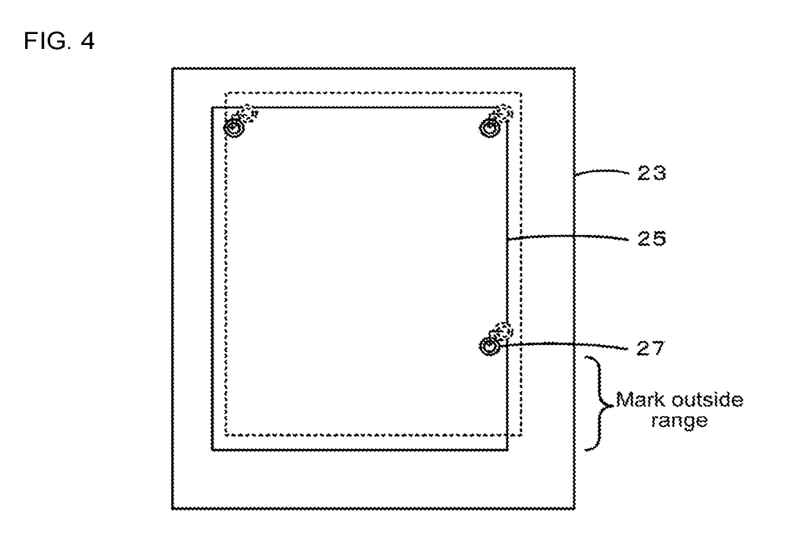
FIG. 4 is a drawing showing a positional deviation of tray main body 25.
Figure 5:
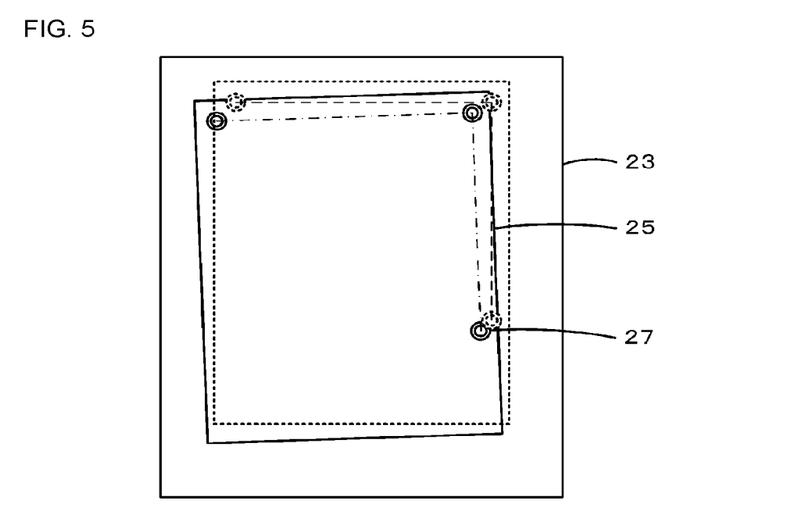
FIG. 5 is a drawing showing a tilting of tray main body 25.
Figure 6:
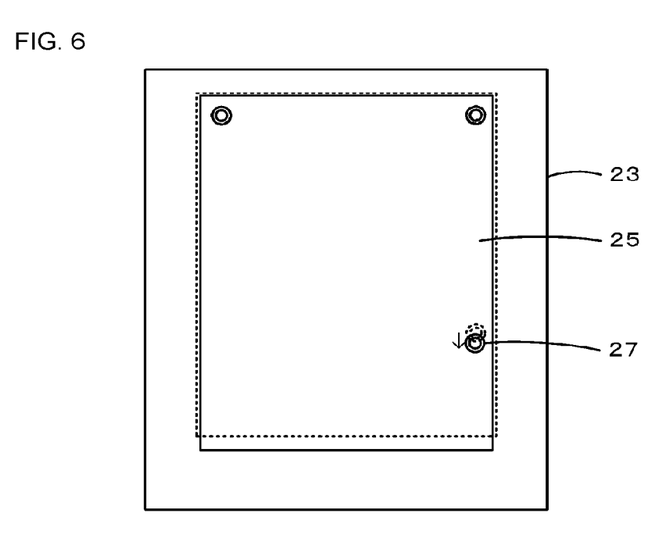
FIG. 6 is a drawing showing a deformation of tray main body 25.

FIG. 4 is a drawing showing a positional deviation of tray main body 25. FIG. 5 is a drawing showing a tilt of tray main body 25. FIG. 6 is a drawing showing a deformation (i.e., an elongation) of tray main body 25. As shown in FIG. 4, a positional deviation of tray main body 25 can be observed from a difference between coordinates serving as references for fiducial marks 27 (dotted lines in figure) and coordinates of fiducial marks 27 in the captured image. Since a component P deviates in position in the same way as the position of tray main body 25, the position of suction nozzle 17 may be shifted by the correction value so that the position of the suction nozzle 17 shifts in the same way as tray main body 25. Further, as shown in FIG. 5, the tilt of tray main body 25 can be observed from a tilt of a straight line that connects at least two fiducial marks 27. A correction value of the tilt can be obtained from an amount of positional deviation that matches the tilt of tray main body 25. Further, as shown in FIG. 6, the deformation of tray main body 25 can be observed by observing how a third fiducial mark 27 deviates in position when at least two fiducial marks 27 are used as a reference. For example, as shown in FIG. 6, when the distance between two points is constant while the distance to a third point differs indicates that tray main body 25 has expanded or contracted at a certain ratio. In this case, the value for shifting the position of suction nozzle 17 is obtained by taking the certain ratio into consideration. Further, when the third fiducial mark 27 deviates in the left-and-right direction, by obtaining a ratio how tray main body 25 is distorted in the left-and-right direction, the value for shifting the position of suction nozzle 17 is obtained by taking the ratio into consideration.

After step S150, CPU 31 stores the correction value and performs control such that mounting unit 13 collects components using the correction value (step S240). As a result of the position, tilt, and deformation of tray main body 25 being corrected, components P to be collected can be collected at an accurate position. Next, CPU 31 determines whether there is a component P to be collected next (step S250). If CPU 31 determines that there is a component P to be collected next, CPU 31 then determines whether the component P to be collected resides on another tray member 24 (step S260). When CPU 31 determines that the component P to be collected does not reside on another tray member 24, that is, when the component P to be collected next resides on the tray member 24 that is currently in the collection position, CPU 31 executes steps S240 onward using the current correction value. On the other hand, when CPU 31 determines in step S260 that a component P to be collected next resides on another tray member 24, the CPU 31 moves the tray member 24 that is currently in the collection position to the initial position (step S270) and executes steps S120 onward. That is, CPU 31 moves the relevant tray member 24 to the collection position in step S120 and determines in step S130 whether tray member 24 is being drawn out for a first time.

When it is determined that the tray member 24 is not being drawn out for a first time, that is, when it is determined that the relevant tray member 24 is being drawn out for a second time or onward, control unit 31 determines which mode is currently set (step S160). When it determined that the mode currently set is the second mode, assuming that correction values are obtained using the first correction process every time the tray member 24 is drawn out, CPU 31 performs control such that mark camera 18 capture images of fiducial marks 27 at two locations (step S170) to calculate correction values by which the position and tilt of tray main body 25 are to be corrected (step S180). For the correction value for deformation of tray main body 25, the correction value obtained initially may be used repeatedly.

Next, CPU 31 determines whether the obtained correction values continue to stay within a permissible range (step S190). This determination is made to see whether a correction value needs to be obtained every time. For example, when there has been almost no change in the correction values obtained several times, even though the tray main body 25 is found to deviate in position or be tilted, the tray main body 25 can be considered fixed in place without deviating in position or tilting further from that state. In this case, even though the correction value obtained once is used repeatedly, the mounting unit 13 can ensure the suction position of components P is accurate. Here, the "predetermined permissible range" may be, for example, a range that is obtained empirically in which the correction values appear unchanged, and this predetermined permissible range can be a variable range of +/−10%. In addition, "continue" may be defined empirically as, for example, three consecutive times, five consecutive times, or the like. If the obtained correction values do not continue to stay within the predetermined permissible range, CPU 31 continues with steps S240 onward. On the other hand, if the obtained correction value continues to stay within the predetermined permissible range, CPU 31 shifts the mode to the first mode in which correction values are obtained less frequently (step S200) and then executes steps S240 onward.

On the other hand, if the first mode is set in step S160, information on the deviation of the collection position of the component P is obtained (step S210). The information on the positional deviation of the collection position includes an amount of positional deviation between component P and suction nozzle 17 when component P is collected by suction nozzle 17. The deviation of the collection position can be obtained by capturing an image of component P by component camera 19 after the component P is collected by suction nozzle 17 in step S240. The information on the positional deviation may include, for example, multiple deviation amounts of the collection position obtained in the way described above after the determination is made in advance. Following this, CPU 31 determines whether the deviation amount of the collection position of the component P is outside of the permissible range (step S220). For example, the "permissible range" may be determined empirically as a range where even if there is a deviation in the collection position, the deviation has little influence on the mounting of the component P. When the deviation amount of the collection position of the component P is within the permissible range, the CPU 31 continues with steps S240 onward. On the other hand, when the deviation amount of the collection position of the component P is outside of the permissible range, CPU 31 shifts the mode to the second mode (step S230) and executes steps S240 onward in order to increase the accuracy with which the position of tray main body 25 is corrected. Then, when it determines in step S250 that there is no component to be collected next or that supply of components has been exhausted, CPU 31 ends this routine.

Here, the correspondence between constituent elements of the embodiment and constituent elements of the disclosure will be clarified. Tray member 24, fiducial marks 27, mark camera 18, control unit 30, and mounting unit 13 of the embodiment correspond to a tray member, fiducial marks, a mark camera, a control unit, and a mounting unit of the disclosure, respectively.

Control unit 30 of the embodiment described above executes the first mode of, at least when tray member 24 is first moved to the collection position, capturing the image of fiducial marks 27 and obtaining the correction value by which the collection position of the component P is corrected based on the positions of the fiducial marks 27 in the captured image. Further, the control unit 30 executes the second mode of, when the tray member 24 is moved to the collection position, capturing the image of the fiducial marks 27 and obtaining the correction value by which the collection position of the component P is corrected based on the positions of the fiducial marks 27 in the captured image more frequently than in the first mode. In the mounting apparatus, the component P can be collected more accurately by executing the second mode, or the component P can be collected more efficiently by executing the first mode. The first mode is a mode of obtaining a correction value when the tray member 24 is first moved to the collection position at least when a new production starts or when trays are replaced. In the mounting apparatus 11, since components P can be collected using the correction value obtained upon resuming the start of new production or after the replacement of trays, components P can be collected more efficiently.

Further, since control unit 30 shifts the mode from the second mode to the first mode when the correction values obtained in the second mode continue to be within the permissible range, in this mounting apparatus, when the correction value continues to stay within the permissible range, that is, when the positional deviation of tray member 24 is small, executing the first mode in which the correction value is obtained less frequently enables components P to be collected more efficiently while highly accurate collection of components P continues. Furthermore, control unit 30 obtains information on the positional deviation of the component P collected by mounting unit 13 for collecting components P accommodated in tray member 24 (i.e., information on the deviation of the collection position) and shifts the mode from the first mode to the second mode when the positional deviation amount is outside of the permissible range. In this mounting apparatus, in the first mode, when the positional deviation of the component P collected is outside of the permissible range, that is, when the positional deviation of the component collected is large, the mode is shifted to the second mode, thereby making it possible to collect components more accurately. Then, in the second mode, the control unit 30 obtains a correction value every time a tray member 24 reaches the collection position, thereby making it possible to collect components P far more accurately.

Further, control unit 30 executes the first correction process of capturing an image of fiducial marks 27 at two locations on tray member 24 and obtaining a correction value by which the position and tilt of tray member 24 are corrected based on the positions of the fiducial marks 27 in the captured image. Further, control unit 30 executes the second correction process of capturing the image of fiducial marks 27 at three locations on tray member 24 and obtaining a correction value by which a position, a tilt, and deformation of the tray member 24 are corrected based on the positions of the fiducial marks 27 in the captured image. In this mounting apparatus, components can be collected more efficiently by executing the first correction process that uses the fiducial marks 27 at two locations, whereas components can be collected more accurately by executing the second correction process of correcting not only the position and the tilt of the tray member 24 but also the deformation thereof by using the fiducial marks 27 at three or more locations. Further, control unit 30 executes the second correction process when tray member 24 is first moved to the collection position at least when a new production is started or when trays are replaced and thereafter executes the first correction process. In this mounting apparatus, firstly, since not only the position and the tilt of the tray member 24 but also the deformation thereof is corrected, components can be collected more accurately, after which measuring a correction value for deformation is omitted, thereby making it possible to collect components P more efficiently.

It is to be understood that the present disclosure is not limited to the above-described embodiment and may be implemented in various modes provided they fall within the technical scope of the present disclosure.

For example, in the embodiment described above, the mode is described as being switched between a first mode and a second mode based on the fluctuation of the correction value and the deviation amount of the collection position. However, the disclosure is not limited thereto, and the mode may be switched according to other parameters. Alternatively, one of either the first mode or the second mode may be executed based on a setting made by an operator. In addition, the first mode is described as being a mode in which the correction value is obtained only when tray main body 25 is first moved. However, in the first mode, a correction value may be obtained periodically when tray main body 25 is moved for a second time onward as long as the frequency at which correction values are obtained is lower than in the second mode. Similarly, the second mode is described as being a mode of obtaining a correction value every time tray member 24 is drawn out of magazine section 21. However, in the second mode, a correction value does not have to be obtained periodically as long as the frequency at which correction values are obtained is higher than in the first mode. Further, in the first mode, control unit 30 may shift the mode from the first mode to the second mode when the obtained correction value continues to be outside of the predetermined permissible range. In this mounting apparatus, when the correction value does not continue to be within the permissible range or the positional deviation of tray member 24 fluctuates greatly, the second mode is executed in which correction values are obtained at a high frequency so that components P are collected more accurately.

Although not particularly described in the embodiment described above, control unit 30 may execute the second mode when control unit 30 obtains information on a component P accommodated in tray main body 25 to find out whether the component P is a component that needs to be located in a predetermined highly accurate position. In this mounting apparatus, a component that needs to be located in a highly accurate position can be collected more accurately. Here, "a component that needs to be located in a highly accurate position" includes, for example, a component that is disposed on a component that has been disposed on the substrate before, a component that is disposed closely to a component that has been disposed on the substrate before, or the like.

Although not particularly described in the embodiment described above, for example, control unit 30 may execute the second correction process when control unit 30 obtains information on a component P accommodated in the tray member 24 to find out whether the component P is a component that needs to be located in a predetermined highly accurate position. In this mounting apparatus, a component that needs to be located in a highly accurate position can be collected more accurately.

In the embodiment described above, the second correction process is described as being executed when tray member 24 is first drawn out, and the first correction process is described as being executed when tray member 24 is drawn out for a second time onward. However, the disclosure is not limited thereto. For example, when the correction value obtained for deformation continues to be within the predetermined permissible range while the second correction process continues, control unit 30 may shift the correction process from the second correction process to the first correction process. In this mounting apparatus, since the correction of the deformation of tray member 24 is omitted when the deformation of tray member 24 fluctuates within the permissible range, components P can be collected more efficiently. Here, "while the second correction process continues" includes a continuation without intermission in which the second correction process is executed every time the tray member is moved as well as a continuation with intermission in which the second correction process is executed every predetermined count number the tray member is moved or after a predetermined length of time has elapsed after the tray member is moved. Further, the "predetermined permissible range" may be, for example, a range that is obtained empirically in which the correction values appear unchanged, and this predetermined permissible range can be a variable range of +/−10%. Further, when mounting unit 13 for collecting components P accommodated in tray member 24 obtains information on the deviation of the collection position of the component P collected and determines that the positional deviation is outside of the permissible range, control unit 30 may switch the correction process from the first correction process to the continuation of the second correction process. In this mounting apparatus, when the positional deviation of the component P collected is outside of the permissible range, that is, when the positional deviation of the component P collected is large, the second correction process that corrects not only the position and tilt but also the deformation of the tray member 24 continues, thereby making it possible to collect components more accurately.

In the embodiment described above, a configuration in which the second correction process is executed in the second mode while the first correction process is executed in the first mode is described as the main combination, however, the disclosure is not limited thereto. For example, various combinations may be made that include a configuration in which the second correction process is executed in the first mode while the first correction process is executed in the second mode.

In the embodiment described above, switching between the first mode and the second mode and switching between the first correction process and the second correction process are both described as being executed together, however, either of the two switching operations may be omitted. Even if this is implemented, components P can be collected more accurately, or components P can be collected more efficiently. Alternatively, in the embodiment described above, both the first mode and the second mode are provided, but one of them may be omitted. In the embodiment described above, both the first correction process and the second correction process are provided, but one of them may be omitted. Specifically, for example, control unit 30 may execute a mode (i.e., the first mode) of capturing an image of fiducial marks 27 when tray member 24 is first moved to the collection position and obtaining a correction value by which the collection position of components P is corrected based on the positions of the fiducial marks 27 in the captured image through a correction process (i.e., the second correction process) of capturing images of the fiducial marks 27 at three or more locations of the tray member 24 and obtaining a correction value by which the position, tilt, and deformation of the tray member 24 are corrected based on the positions of the fiducial marks 27 in the captured image. In this mounting apparatus, components P can be collected more efficiently by executing the first mode, and components P can be collected more accurately by executing the second correction process.

In the embodiment described above, fiducial marks 27 at three locations are described as being used in the second correction process, however, the disclosure is not limited thereto as long as fiducial marks 27 at three or more locations are used. In mounting apparatus 11, since the image capturing time and the image analyzing time become longer as the number of image capturing locations increases, although the mounting process is highly accurate, mounting processing requires a certain length of time.

In the embodiment described above, the frequency with which correction values are obtained is described as a value that fluctuates. However, for example, when the correction value fluctuates within a range that does not require a predetermined correction, the correction itself may be omitted. In such a mounting apparatus, components P can be collected more efficiently by omitting corrections.

In the embodiment described above, the disclosure is described as being applied to mounting apparatus 11. However, the disclosure is not limited thereto, and may be applied to a mounting method or a program that executes the mounting method. In this mounting method, the various modes of the mounting apparatus that have been described above may be adopted. Alternatively, steps may be added that can implement the various functions of the mounting apparatus described above.

INDUSTRIAL APPLICABILITY

The disclosure can be applied to the field of mounting electronic components.

DESCRIPTION OF REFERENCE NUMERALS AND CHARACTERS

Mounting system, 11 Mounting apparatus, 12 Substrate conveyance unit, 13 Mounting unit; 15 Head moving section; 16 Mounting head; 17 Suction nozzle; 18 Mark camera; 19 Component camera; 20 Component supply unit; 21 Magazine section; 23 Pallet; 24 Tray member; 25 Tray main body; 26 Fixing member; 27 Fiducial mark; 30 Control unit; 31 CPU, 32 Memory section; 40 Management PC, P Component, S Substrate.

The invention claimed is:
1. A mounting apparatus for collecting and mounting components, the mounting apparatus comprising:

a tray configured to move between an accommodating position and a collection position, the tray having fiducial marks in multiple positions and the tray accommodating components;

a camera configured to capture an image of the fiducial marks; and a control unit, including a processor, configured to execute a first mode of, at least when the tray is first moved to the collection position, controlling the camera to capture an image of the fiducial marks and calculating a first correction value by which the collection position of the tray is to be corrected based on the positions of the fiducial marks in the captured image, and correcting a position of a component on the tray being based on the first correction value;

execute a second mode of, when the tray is moved to the collection position, controlling the camera to capture an image of the fiducial marks and calculating a second correction value by which the collection position of the tray is to be corrected based on the positions of the fiducial marks in the captured image, and correcting the position of the component on the tray based on the second correction value; and shift the second mode to the first mode if the second correction value for deformation, obtained while continuously performing the second mode, is continuously within a predetermined permissible range.

2. The mounting apparatus according to claim 1, wherein the control unit executes the first mode when the tray is first moved to the collection position at least when a new production is started or when trays are replaced.

3. The mounting apparatus according to claim 1, wherein the control unit executes the second mode when the control unit obtains information on components accommodated in the tray and the components are components that need to be positioned with high accuracy.

4. The mounting apparatus according to claim 1, wherein the control unit shifts execution from the first mode to the second mode when the control unit obtains information on a positional deviation of a component collected by a collection member for collecting components accommodated in the tray and the positional deviation is outside of a predetermined permissible range.

5. The mounting apparatus according to claim 1, wherein in the second mode the control unit is configured to obtain the second correction value every time the tray reaches the collection position.

6. The mounting apparatus according to claim 1, wherein the control unit is configured to execute a first correction process of capturing an image of the fiducial marks at two locations on the tray and obtaining the first correction value by which the position and the tilt of the tray are corrected based on the positions of the fiducial marks in the captured image, and a second correction process of capturing an image of the fiducial marks at three or more locations on the tray and obtaining the second correction value by which the position, the tilt, and the deformation of the tray are corrected based on the positions of the fiducial marks in the captured image.

7. The mounting apparatus according to claim 6, wherein the control unit is configured to execute the second correction process when the tray is moved to the collection position at least when a new production is started or when trays are replaced and then execute the first correction process.

8. The mounting apparatus according to claim 6, wherein the control unit is configured to execute the second correction process when the control unit obtains information on a component accommodated in the tray and the component is a component that needs to be positioned with high accuracy.

9. The mounting apparatus according to claim 6, wherein the control unit shifts execution from the first correction process to continuously performing the second correction process when the positional deviation is outside of a predetermined permissible range after the control unit obtains information on a positional deviation of a component collected by a collection member that collects components accommodated in the tray.

10. The mounting apparatus according to claim 1, wherein the control unit is configured to, when the tray is first moved to the collection position, execute the first to obtain the first correction value correcting values of position, tilt, and deformation of the tray, based on positions of the fiducial marks of which images are captured at three or more locations on the tray by the camera.

* * * * *